(12) United States Patent
Tu et al.

(10) Patent No.: US 8,476,745 B2
(45) Date of Patent: Jul. 2, 2013

(54) INTEGRATED CIRCUIT CHIP WITH REDUCED IR DROP

(75) Inventors: Chao-Chun Tu, Hsin-Chu (TW);
Shih-Hung Lin, Hsinchu (TW);
Chih-Chien Huang, Yunlin County (TW); Tien-Chang Chang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 440 days.

(21) Appl. No.: 12/435,398

(22) Filed: May 4, 2009

(65) Prior Publication Data
US 2010/0276805 A1 Nov. 4, 2010

(51) Int. Cl.
*H01L 23/495* (2006.01)
(52) U.S. Cl.
USPC ........... 257/666; 257/698; 257/731; 257/668; 257/686; 257/786; 257/692; 385/14
(58) Field of Classification Search
USPC ................. 257/666, 698, 731, 668, 686, 786, 257/659, 692, 700, 707, 710, 735, 750, 783; 385/14
See application file for complete search history.

(56) References Cited

U.S. PATENT DOCUMENTS

| | | | | |
|---|---|---|---|---|
| 2003/0040161 | A1* | 2/2003 | Schrenk et al. | 438/393 |
| 2004/0113190 | A1* | 6/2004 | Oh et al. | 257/296 |
| 2005/0247968 | A1* | 11/2005 | Oh et al. | 257/306 |
| 2006/0281247 | A1* | 12/2006 | De Zaldivar | 438/238 |
| 2007/0145452 | A1* | 6/2007 | Oh et al. | 257/306 |
| 2007/0148825 | A1* | 6/2007 | Kikuta et al. | 438/118 |
| 2008/0158777 | A1* | 7/2008 | Sohn et al. | 361/321.1 |

* cited by examiner

*Primary Examiner* — Telly Green
(74) *Attorney, Agent, or Firm* — Winston Hsu; Scott Margo

(57) ABSTRACT

An integrated circuit chip includes a semiconductor substrate; a first interconnection wire having a first portion and a second portion on the semiconductor substrate, wherein the second portion is separated from the first portion; a second interconnection wire situated under the first interconnection wire; a first conductive via electrically coupling the first portion with the second interconnection wire; a conductive layer situated between the first interconnection wire and the second interconnection wire; and a second conductive via electrically coupling the conductive layer with the second portion.

19 Claims, 6 Drawing Sheets

INTEGRATED CIRCUIT CHIP WITH REDUCED IR DROP

BACKGROUND OF THE INVENTION

1. Field of the Invention

The present invention relates generally to the field of semiconductor integrated circuit devices. More particularly, the present invention relates to an improved integrated circuit chip and its interconnection scheme that are capable of reducing IR drop over the chip.

2. Description of the Prior Art

In the processes for designing a large-scale integrated semiconductor circuit device, respective blocks of the device are generally designed in parallel to complement device characteristics with one another. During the designing the large-scale device, the building-block type of method is utilized, in which the circuit of the device is divided into a plurality of circuit blocks and each of the circuit blocks is thus designed at the same time. The overall design of the device is then carried out by integrating these constituent blocks.

An integrated circuit (IC) usually has a larger number of circuit blocks and multiple levels of conductors are used to distribute power and signals from off the IC to the circuit blocks within the IC, between the circuit blocks, and between cells within each circuit block.

It is well known that the conductors are formed by lithographically patterning a layer of conductive material to form conductive lines as viewed from above the IC substrate. The conductive layers with conductive lines formed therein are isolated by an insulating layer so that lines of one layer which cross another layer do not physically or electrically contact each other. When it is desired to electrically couple a conductive line formed in one layer to a conductive line formed in another layer, a conductive via is formed extending through the insulating layer between the two conductors.

Typically, the topmost two levels of the interconnection metal layers are used for power and ground routing in an integrated circuit chip. However, this approach unavoidably induces high voltage drop (or IR drop), which results in increased power consumption and reduced signal timing speed. Therefore, there is a strong need in this industry to provide an improved power and ground routing for the integrated circuit chip devices that is capable of reducing the metal layer resistance, and thus lowering the IR drop over a chip, thereby improving the chip performance.

SUMMARY OF THE INVENTION

It is one object of the invention to provide an interconnection structure that is compatible with current semiconductor manufacturing process and is capable of reducing the metal layer resistance, and thus lowering the IR drop over an integrated circuit chip.

It is another object of the invention to provide an integrated circuit chip device that utilizes metal-insulator-metal (MIM) or MIM-like structure to reduce the metal layer resistance, and thus lower the IR drop over a chip, thereby improving the performance thereof, such as power consumption and speed.

To these ends, according to one aspect of the present invention, there is provided an integrated circuit chip including a semiconductor substrate; a first interconnection wire having a first portion and a second portion on the semiconductor substrate, wherein the second portion is separated from the first portion; a second interconnection wire situated under the first interconnection wire; a first conductive via electrically coupling the first portion with the second interconnection wire; a conductive layer situated between the first interconnection wire and the second interconnection wire; and a second conductive via electrically coupling the conductive layer with the second portion. The conductive layer may electrically interconnect with a third interconnection wire that is coplanar with the first interconnection wire through a third conductive via.

In one aspect, an integrated circuit chip includes a semiconductor substrate having thereon a plurality of metal layers; a power or ground wire having a first portion and a second portion formed in a topmost layer of the plurality of metal layers, wherein the second portion is separated from the first portion; a lower interconnection wire situated under the power or ground wire; a first conductive via formed in an inter-metal dielectric (IMD) layer between the power or ground wire and the lower interconnection wire for electrically coupling the first portion with the lower interconnection wire; and a metal-insulator-metal (MIM) structure formed in the IMD layer being electrically coupling to the second portion through a second conductive via.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention pertains to an interconnection structure that is compatible with current semiconductor manufacturing process and is capable of reducing the metal layer resistance, and thus lowering the IR drop over an integrated circuit chip, thereby improving the performance thereof, such as power consumption and speed. In one aspect, the invention pertains to an integrated circuit chip device that incorporates metal-insulator-metal (MIM) or MIM-like structure into the interconnection network, such as power or ground signal lines, to reduce the IR drop over the chip thereby improving the performance thereof. The present invention interconnection structure may be used in digital circuit. Further, the present invention interconnection structure may provide additional routing path in the integrated circuit chip.

The embodiments of this invention will now be explained with the accompanying figures. Throughout the specification and drawings, the symbol "Mn" refers to the topmost level of the metal layers fabricated in the integrated circuit chip, while "Mn−1" refers to the metal layer that is just one level lower than the topmost metal layer and so on, wherein, in some embodiments, n ranges between 5 and 8 but not limited thereto. The symbol "V" refers to the via plug between two adjacent conductive metal layers. For example, V5 refers to the via plug interconnecting M5 to M6.

Figure 1:
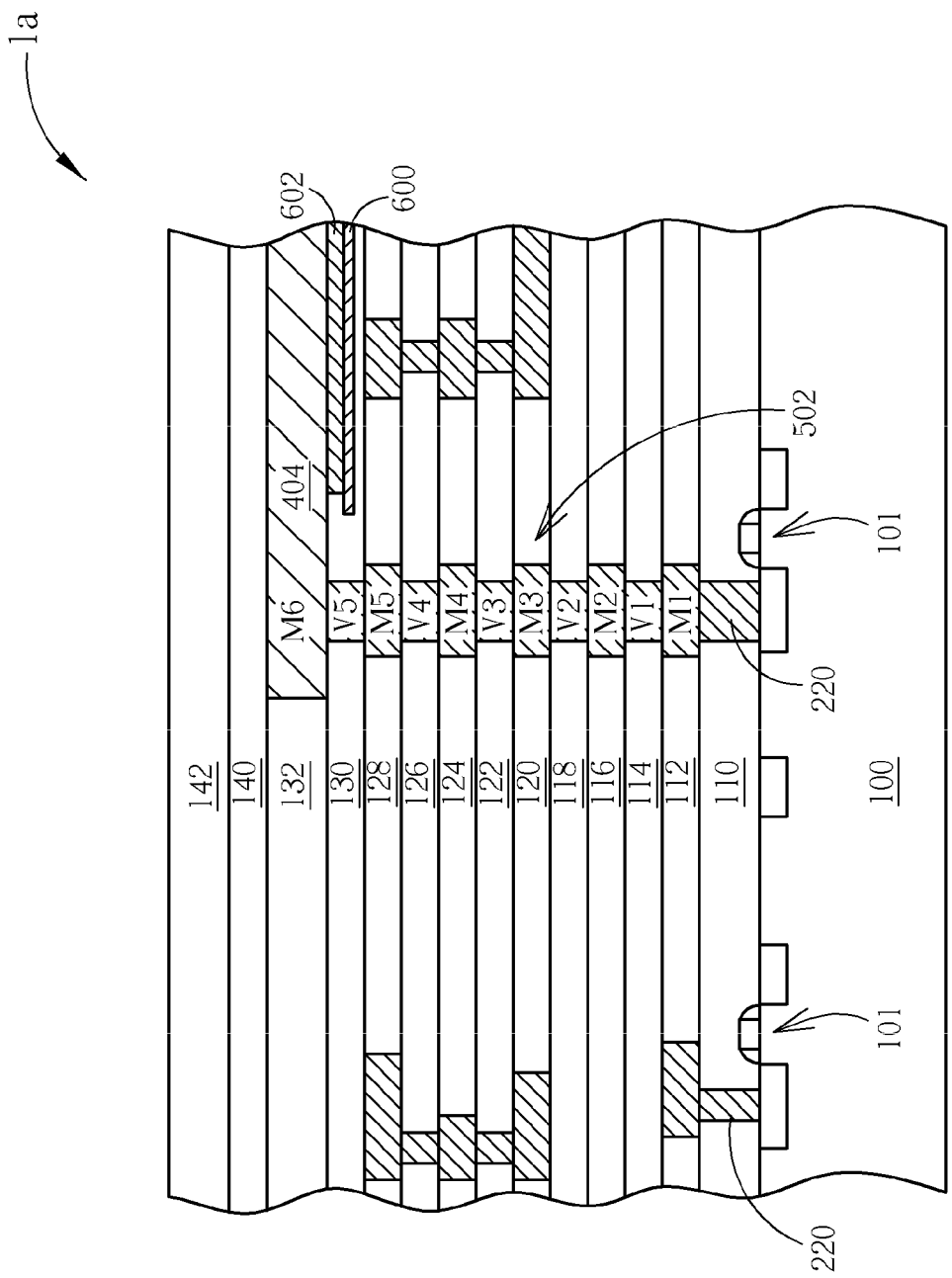
FIG. 1 is a schematic, cross-sectional diagram illustrating a portion of the exemplary integrated circuit chip that is fabricated with six levels of copper metal layers in accordance with one embodiment of this invention.

FIG. 1 is a schematic, cross-sectional diagram illustrating a portion of an exemplary integrated circuit chip 1a that is fabricated with six levels of copper metal layers (M1-M6) in accordance with one embodiment of this invention. Though the metal layers in this embodiment are made of copper, the material of the metal layers may include copper, aluminum, a combination thereof or other suitable materials. The integrated circuit chip 1a depicted in FIG. 1 is fabricated based on a so-called 1P6M scheme (one polysilicon layer and six copper metal layers). However, this invention is also applicable to other interconnection schemes such as 1P3M, 1P4M, 1P5M, 1P7M or 1P8M etc.

As shown in FIG. 1, the exemplary integrated circuit chip 1a includes a semiconductor substrate 100 such as a silicon substrate, a silicon-on-insulator (SOI) substrate, SiGe substrate or the like. A plurality of inter-metal dielectric (IMD) layers 110-132 are deposited over the semiconductor substrate 100. Circuit elements 101 such as transistors, capacitors or memory cells are fabricated on the main surface of the semiconductor substrate 100. The IMD layers 110-132 may be formed of low dielectric constant (low-k) materials or ultra low-k materials, but not limited thereto. The IMD layers 110-132 may comprise conventional dielectric layer such as silicon oxide, silicon nitride, silicon carbide or silicon oxynitride. The low-k or ultra low-k materials described herein may be either organic (e.g., SiLK) or inorganic (e.g., HSQ) and may be of a porous or non-porous nature.

According to the first embodiment of this invention, M1-M6 and respective vias V1~V5 may be fabricated using copper damascene processes or dual damascene processes, which are well known in the art and are thus not discussed further. The first level of the copper metal layers, i.e., M1 is fabricated in the IMD layer 112. A contact plug 220, such as tungsten plug, may be formed in the IMD layer 110 to interconnect M1 to the circuit elements 101. The second level of the copper metal layers, i.e., M2 is fabricated in the IMD layer 116. A via plug V1, such as damascened copper plug integrated with M2, is formed in the IMD layer 114 to interconnect M1 to M2. The third level of the copper metal layers, i.e., M3 is fabricated in the IMD layer 120. A via plug V2 is formed in the IMD layer 118 to interconnect M2 to M3. The fourth level of the copper metal layers, i.e., M4 is fabricated in the IMD layer 124. A via plug V3 is formed in the IMD layer 122 to interconnect M3 to M4. The fifth level of the copper metal layers, i.e., M5 is fabricated in the IMD layer 128. A via plug V4 is formed in the IMD layer 126 to interconnect M4 to M5. The topmost level of the copper metal layers, i.e., M6 is fabricated in the IMD layer 132. A via plug V5 is formed in the IMD layer 130 to interconnect M5 to M6. A first passivation layer 140 may be deposited on the IMD layer 132 and cover the exposed M6 layer. The first passivation layer 140 may comprise silicon oxide, silicon nitride, polyimide or other suitable materials. A second passivation layer 142 may be deposited on the first passivation layer 140. The second passivation layer 142 may comprise silicon oxide, silicon nitride, polyimide or other suitable materials.

The integrated circuit chip 1a may further comprise a power or ground ring 404 that is formed in IMD layer 132 for distributing power or ground signals to the circuit element 101 by way of, for example, the via stack 502. It is one feature of this invention that the power or ground ring 404 for distributing power or ground signals to a circuit block of the integrated circuit chip 1a may be electrically coupled with an underlying conductive structure 600 through a conductive via 602. As shown in FIG. 1, the conductive structure 600 and the conductive via 602 are both fabricated in the IMD layer 130 between M5 layer and M6 layer where the via plug V5 is formed. According to this invention, the conductive structure 600 may be a conductive layer formed simultaneously with a top plate or a bottom plate or both of a MIM structure or a MIM-like structure, or a top plate or a bottom plate or both of a MIM structure or a MIM-like structure, which could be formed simultaneously with a MIM capacitor in other portion of the integrated circuit chip 1a. The conductive structure 600 and the conductive via 602 may be both a line-shaped layout that substantially conforms to the pattern of the overlying power or ground ring 404.

Figure 2:
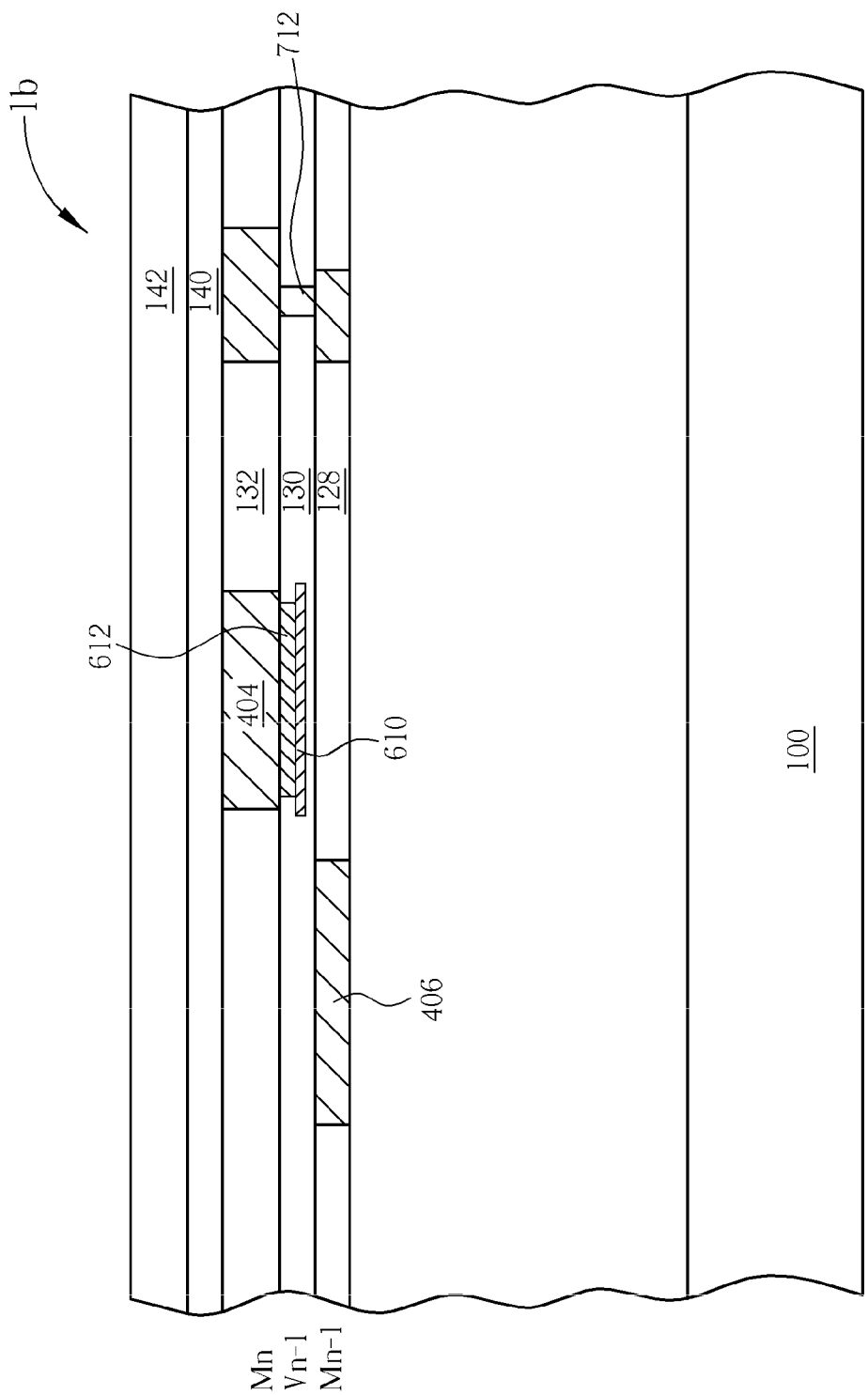
FIG. 2 is a schematic, cross-sectional diagram illustrating another embodiment of this invention.

FIG. 2 is a schematic, cross-sectional diagram illustrating another embodiment of this invention, wherein like numeral numbers designate like elements, layers or regions. As shown in FIG. 2, likewise, the integrated circuit chip 1b comprises a semiconductor substrate 100 and circuit elements (not shown in FIG. 2) such as transistors, capacitors or memory cells formed on the semiconductor substrate 100. A number of IMD layers may be deposited over the semiconductor substrate 100. The integrated circuit chip 1b may comprise n layers of copper metal interconnection (M1-Mn) and respective vias ($V_1$-$V_{n-1}$) which may be fabricated using copper damascene processes or dual damascene processes, which are well known in the art and are thus not discussed further. Though the metal interconnections in this embodiment are made of copper, the material of the metal layers may include copper, aluminum, a combination thereof or other suitable materials.

For the sake of simplicity, only IMD layers 128-132 and relevant metal patterns formed in Mn and Mn−1 layers are shown in FIG. 2. A first passivation layer 140 may be deposited on the IMD layer 132 and cover the exposed Mn layer. An upper interconnection wire such as power or ground ring 404 may be formed in IMD layer 132. A lower interconnection wire, which may be power or ground ring 406, could be formed in the IMD layer 128. The IR drop is reduced by coupling a conductive layer 610 formed in the IMD layer 130 with the overlying power or ground ring 404 through the conductive via 612. By doing this, the sheet resistance of the power or ground ring 404 is decreased. The conductive layer 610 may be formed simultaneously with a top plate or a bottom plate of a MIM capacitor in other portion of the integrated circuit chip 1b. The portion of the upper interconnection wire coupled with the conductive layer 610 may be separated from the portion of the upper interconnection wire coupled with the lower interconnection wire. The lower interconnection wire may be coupled with the upper interconnection wire through the via 712.

According to this embodiment, the IMD layer 130 may have a thickness ranging between 7500 angstroms and 8500 angstroms, and the conductive layer 610 may have a thickness ranging between 750 angstroms and 6000 angstroms. In one embodiment, the thickness of the conductive layer 610 is smaller than the thickness of Mn or the thickness of Mn−1 layer. According to this embodiment, the conductive layer 610 may be composed of non-copper conductive material such as aluminum, titanium, titanium nitride, tantalum, tantalum nitride or any combinations thereof. The conductive via 612 has a thickness that is smaller than the thickness of the via 712 in Vn−1 layer. For example, in a case that the IMD layer 130 has a thickness of 8000 angstroms, the thickness of the conductive via 612 may be about 4000 angstroms. The conductive via 612 may be damascened copper via that may be formed integrally with the damascened copper power or ground ring 404.

Figure 3:
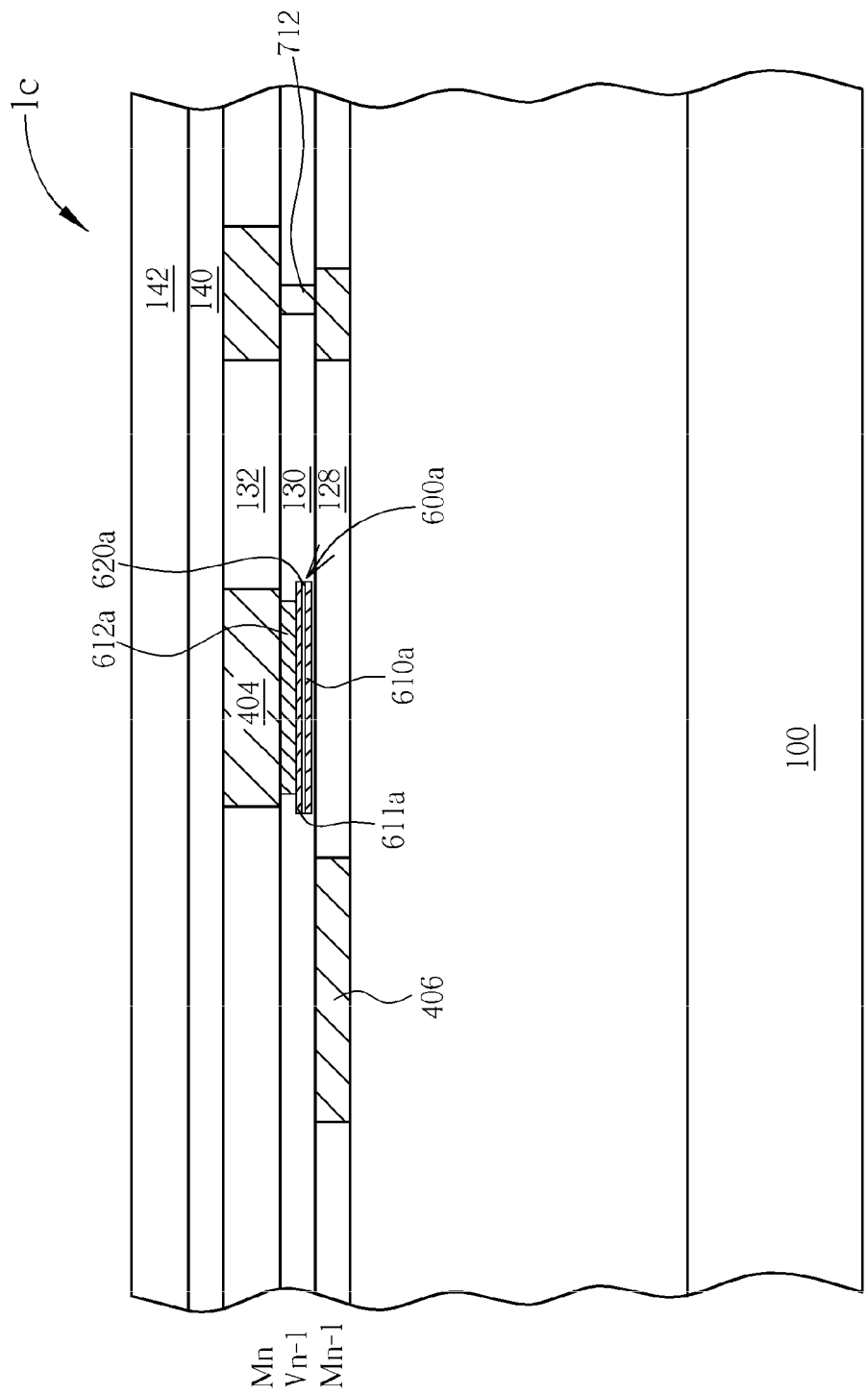
FIG. 3 is a schematic, cross-sectional diagram illustrating yet another embodiment of this invention.

FIG. 3 is a schematic, cross-sectional diagram illustrating yet another embodiment of this invention, wherein like numeral numbers designate like elements, layers or regions. As shown in FIG. 3, likewise, the integrated circuit chip 1c may comprise a semiconductor substrate 100 and circuit elements (not shown in FIG. 3) such as transistors, capacitors or memory cells formed on the semiconductor substrate 100. A number of IMD layers may be deposited over the semiconductor substrate 100. The integrated circuit chip 1c may comprise n layers of copper metal interconnection (M1-Mn) and respective vias ($V_1$-$V_{n-1}$) which may be fabricated using copper damascene processes or dual damascene processes, which are well known in the art and are thus not discussed further. For the sake of simplicity, only IMD layers 128-132 and relevant metal patterns formed in Mn and Mn−1 layers are shown in FIG. 3. Though the metal interconnections in this embodiment are made of copper, the material of the metal layers may include copper, aluminum, a combination thereof or other suitable materials.

According to this embodiment, a metal-insulator-metal (MIM) capacitor structure 600a may be fabricated in the IMD layer 130. The MIM capacitor structure 600a may comprise a conductive layer 610a acting as a lower electrode plate of the MIM capacitor structure 600a, a conductive layer 611a acting as an upper electrode plate, and a capacitor dielectric layer 620a interposed between the conductive layer 610a and the conductive layer 611a. The conductive layer 611a may be electrically coupled with the power or ground ring 404 that is formed in IMD layer 132 through a conductive via 612a. By way of example, the conductive layer 610a may be a layer made of aluminum, titanium, titanium nitride, tantalum, tantalum nitride or any combinations thereof having a thickness of between 2000 and 5500 angstroms, the conductive layer 611a may be a layer made of aluminum, titanium, titanium nitride, tantalum, tantalum nitride or any combinations thereof having a thickness of between 750 and 6000 angstroms, and the capacitor dielectric layer 620a may be an oxide-nitride-oxide (ONO) layer having a thickness of between 250 and 450 angstroms. According to this embodiment, the conductive layer 610a is electrically floating or a dummy layer.

Figure 6:
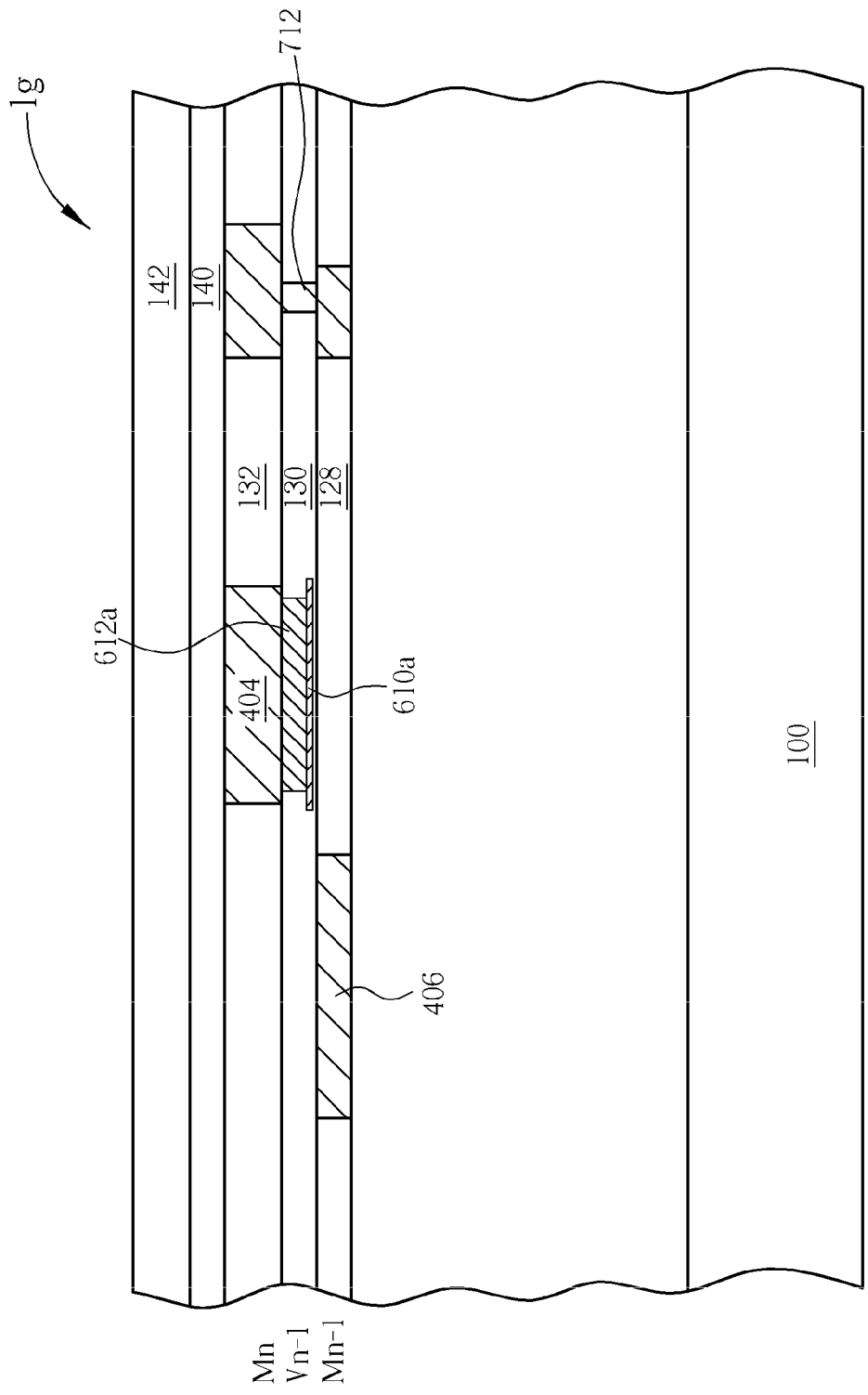
FIG. 6 is a schematic, cross-sectional diagram illustrating yet another embodiment of this invention.

As shown in FIG. 6, in accordance with still another embodiment of this invention, the power or ground ring 404 of the integrated circuit chip 1g may be coupled to the conductive layer 610a directly through the conductive via 612a, wherein the conductive layer 611a and the capacitor dielectric layer 620a are omitted. The conductive layer 610a may be a layer made of aluminum, titanium, titanium nitride, tantalum, tantalum nitride or any combinations thereof having a thickness of between 2000 and 5500 angstroms.

Figure 4:
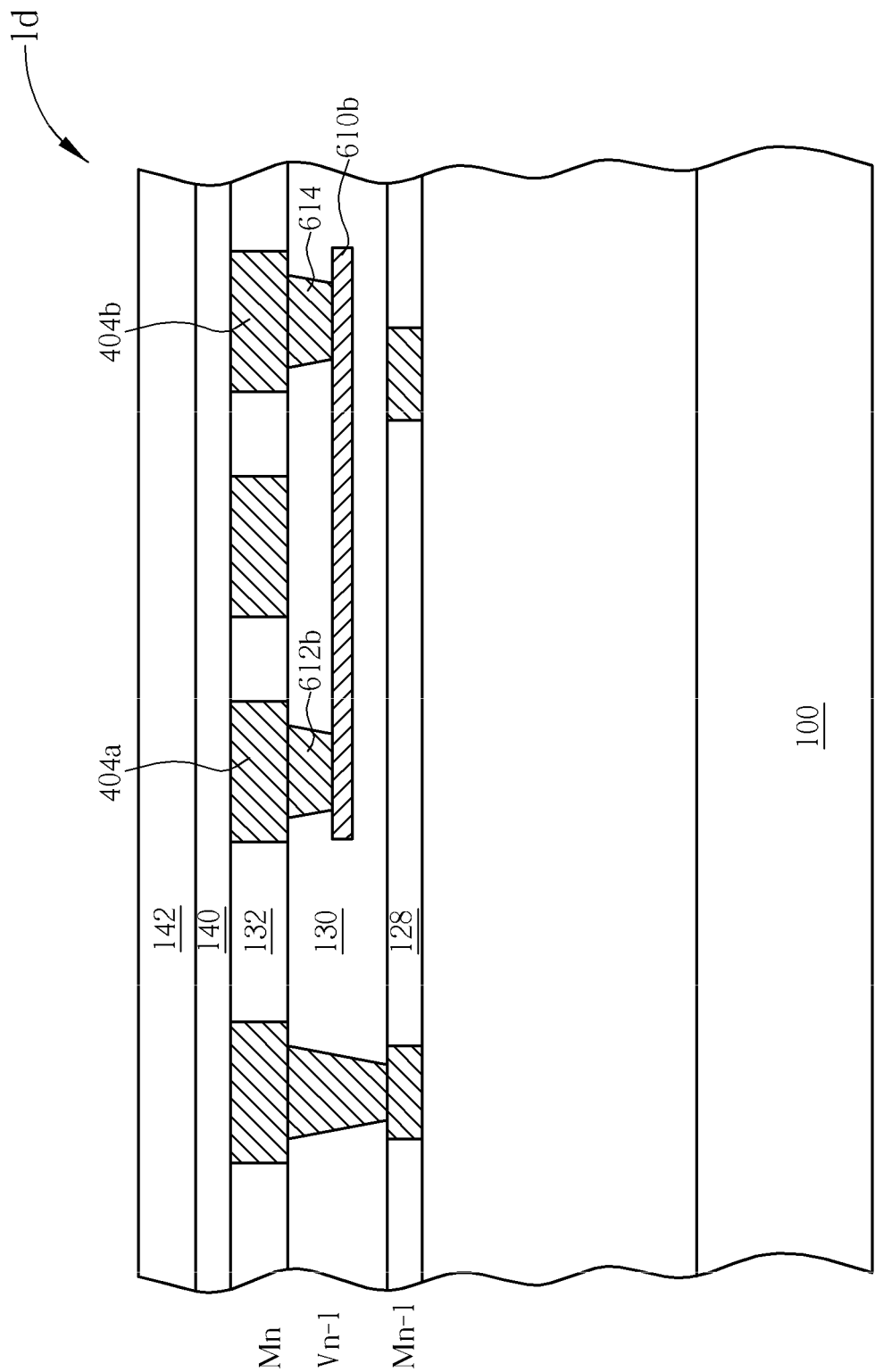
FIG. 4 is a schematic, cross-sectional diagram illustrating yet another embodiment of this invention.

The present invention interconnection structure may provide additional routing path in the integrated circuit chip. FIG. 4 is a schematic, cross-sectional diagram illustrating yet another embodiment of this invention, wherein like numeral numbers designate like elements, layers or regions. As shown in FIG. 4, the integrated circuit chip 1d comprises a semiconductor substrate 100 and circuit elements (not shown in FIG. 4) such as transistors, capacitors or memory cells formed on the semiconductor substrate 100. A number of IMD layers may be deposited over the semiconductor substrate 100. The integrated circuit chip 1d may comprise n layers of copper metal interconnection (M1-Mn) and respective vias ($V_1$-$V_{n-1}$) which may be fabricated using copper damascene processes or dual damascene processes, which are well known in the art and are thus not discussed further. For the sake of simplicity, only IMD layers 128-132 and relevant metal patterns formed in Mn and Mn−1 layers are shown in FIG. 4. Though the metal layers in this embodiment are made of copper, the material of the metal layers may include copper, aluminum, a combination thereof or other suitable materials.

According to this embodiment, at least one conductive layer 610b is fabricated in the IMD layer 130 and is situated between Mn layer and Mn−1 layer. In one embodiment, the conductive layer 610b has smaller thickness than that of Mn layer or that of Mn−1 layer. The conductive layer 610b may be made of conductive material that is different from Mn layer or Mn−1 layer. For example, the conductive layer 610b may comprise aluminum, titanium, titanium nitride, tantalum, tantalum nitride or any combinations thereof. For copper process, the conductive layer 610b may be composed of aluminum. The conductive layer 610b may be electrically coupled with an overlying power or ground ring 404a that is formed in IMD layer 132 through a conductive via 612b. The conductive layer 610b may also interconnect with an adjacent metal wire 404b through a conductive via 614. The conductive layer 610b may be formed simultaneously with a top plate or a bottom plate of a MIM capacitor in other portion of the integrated circuit chip 1d. The vias 612b and 614 may have similar cross section area to that of the via Vn−1. The conductive layer 610b could thus provide a routing path for the integrated circuit chip 1d.

Figure 5:
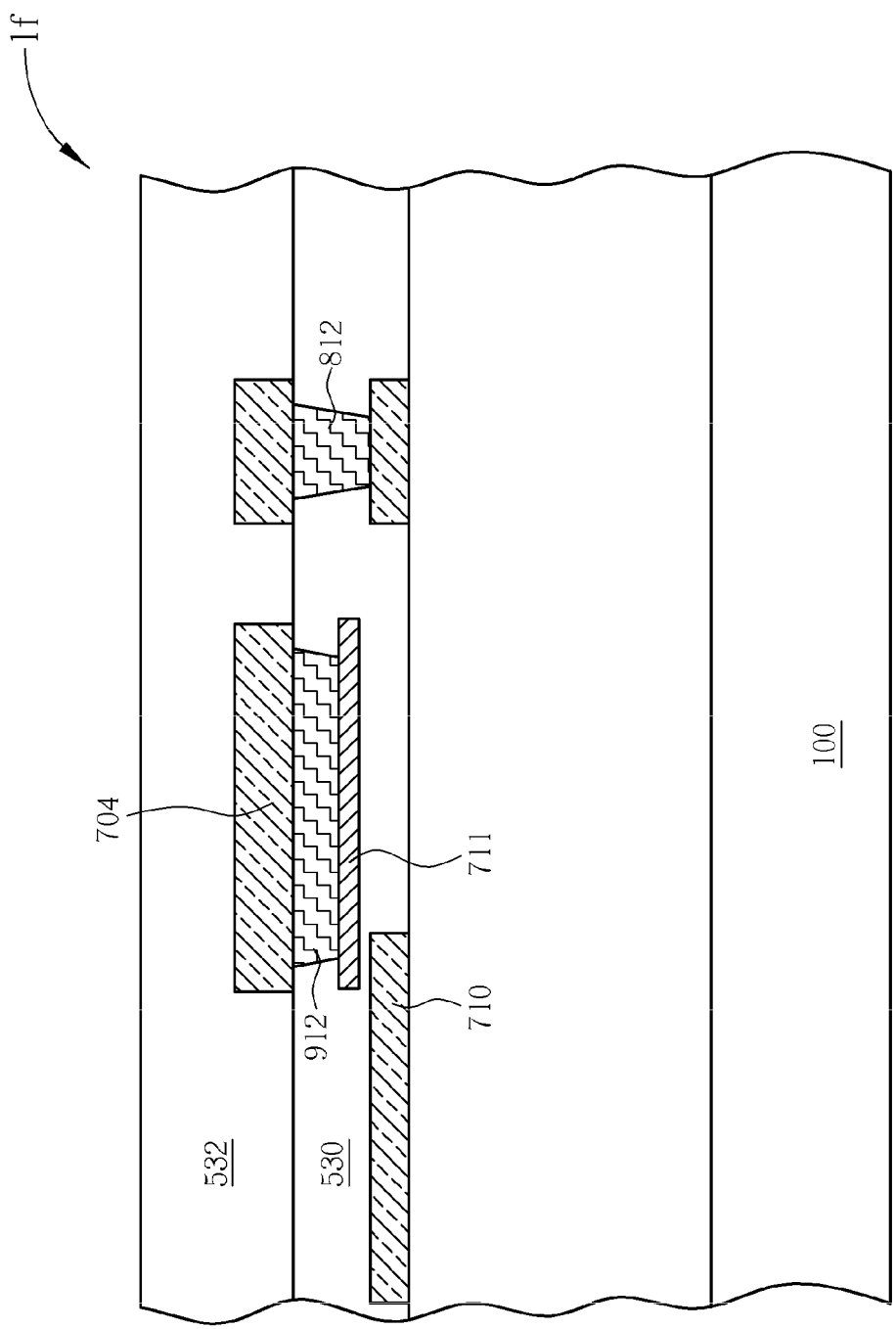
FIG. 5 is a schematic, cross-sectional diagram illustrating yet another embodiment of this invention.

The present invention may be applicable to aluminum processes. FIG. 5 is a schematic, cross-sectional diagram illustrating yet another embodiment of this invention. As shown in FIG. 5, the integrated circuit chip 1f comprises a semiconductor substrate 100 and circuit elements (not shown in FIG. 5) such as transistors, capacitors or memory cells formed on the semiconductor substrate 100. A number of IMD layers may be deposited over the semiconductor substrate 100. The integrated circuit chip 1f may comprise an aluminum power or ground wire 704 formed in its metal interconnection. The aluminum power or ground wire 704 may be covered with a dielectric layer 532. A conductive layer 711, which is embedded in a dielectric layer 530 under the dielectric layer 532, is electrically coupled with the power or ground wire 704 through a conductive via 912. The conductive layer 711 may comprise aluminum, titanium, titanium nitride, tantalum, tantalum nitride or any combinations thereof. The conductive layer 711 is situated between the aluminum power or ground wire 704 and a lower aluminum conductive layer 710. Preferably, the lower aluminum conductive layer 710 is electrically floating or is substantially disposed in a region that does not directly under the aluminum power or ground wire 704 or the conductive layer 711 in order to avoid capacitor coupling effect.

According to this embodiment, the conductive layer 710 may have a thickness of between 4000 and 6000 angstroms, the conductive layer 711 may have a thickness of about 1000-2500 angstroms, and the capacitor dielectric layer 720 may be an ONO layer having a thickness of between 250 and 450 angstroms. In another case, the electrically floating aluminum layer 710 may be eliminated.

Both of the top plate and the bottom plate of an MIM structure can be incorporated into the present invention interconnection scheme. The coupling effect can be reduced or alleviated since the top plate of the MIM is farther with respect to the lower metal wire than the bottom plate. On the other hand, the reduction of sheet resistance is more significant when using the bottom plate of the MIM because of thicker via.

The vias 602, 612, 612a, 612b, 614 and 912 in FIGS. 1-5 may have larger cross section area than that of the vias V5, 712, Vn−1 and 812 in FIGS. 1-5. Alternatively, the vias 602, 612, 612a, 612b, 614 and 912 in FIGS. 1-5 may consist of a plurality of vias to have equivalent larger cross section area than that of the vias V5, 712, Vn−1 and 812 in FIGS. 1-5. The structures or layers 600, 610, 600a, 610b and 700 may be located in other regions besides analog circuit region of the integrated circuit chip, or in the regions not containing the analog circuit. It is to be understood that although the invention structures are incorporated with the top metal layer Mn through FIGS. 1-4, they can be used in other lower metal layers in some embodiments according to this invention.

Those skilled in the art will readily observe that numerous modifications and alterations of the device and method may be made while retaining the teachings of the invention.

What is claimed is:

1. An integrated circuit chip comprising:
   a semiconductor substrate;
   a first interconnection wire having a first portion and a second portion on said semiconductor substrate, wherein said second portion is separated from said first portion;
   a second interconnection wire situated under said first interconnection wire;
   a first conductive via electrically coupling said first portion with said second interconnection wire;
   a conductive layer situated between said first interconnection wire and said second interconnection wire, wherein said conductive layer is line shaped to conform to a pattern of said second portion of said first interconnection wire, and said conductive layer is separated from said second interconnection wire; and
   a second conductive via electrically coupling said conductive layer with said second portion.

2. The integrated circuit chip according to claim 1 wherein said first conductive via and said second conductive via are formed in the same one inter-metal dielectric (IMD) layer.

3. The integrated circuit chip according to claim 2 wherein said first conductive via is thicker than said second conductive via.

4. The integrated circuit chip according to claim 1 wherein said first interconnection wire and said second interconnection wire are copper wires.

5. The integrated circuit chip according to claim 1 wherein said conductive layer is made of non-copper material.

6. The integrated circuit chip according to claim 5 wherein material of said conductive layer comprises aluminum, titanium, titanium nitride, tantalum, tantalum nitride or any combinations thereof.

7. The integrated circuit chip according to claim 1 wherein said conductive layer has a thickness ranging between 750 angstroms and 6000 angstroms.

8. The integrated circuit chip according to claim 1 wherein said first conductive via and said second conductive via are both damascened copper via formed with said first interconnection wire.

9. The integrated circuit chip according to claim 1 wherein said conductive layer is formed simultaneously with a top plate or a bottom plate of a metal-insulator-metal (MIM) capacitor structure.

10. The integrated circuit chip according to claim 1 wherein said conductive layer further electrically interconnects with a third interconnection wire that is coplanar with said first interconnection wire through a third conductive via.

11. An integrated circuit chip comprising:
    a semiconductor substrate having thereon a plurality of metal layers;
    a power or ground wire having a first portion and a second portion formed in a topmost layer of said plurality of metal layers, wherein said second portion is separated from said first portion;
    a lower interconnection wire situated under said power or ground wire;
    a first conductive via formed in an inter-metal dielectric (IMD) layer between said power or ground wire and said lower interconnection wire for electrically coupling said first portion with said lower interconnection wire; and
    a metal-insulator-metal (MIM) structure formed in said IMD layer being electrically coupling to said second portion through a second conductive via, wherein said MIM structure comprises an upper metal plate, a dummy lower metal plate, and a capacitor dielectric layer interposed between said upper metal plate and said dummy lower metal plate, wherein said dummy lower metal plate is electrically floating, and said dummy lower metal plate is line shaped to conform to a pattern of said second portion of said power or ground wire, and said dummy lower metal plate has a bottom surface exposed in said IMD layer.

12. The integrated circuit chip according to claim 11 wherein said MIM structure further comprises an upper metal plate and a capacitor dielectric layer interposed between said upper metal plate and said dummy lower metal plate.

13. The integrated circuit chip according to claim 12 wherein said upper metal plate is electrically coupled to said power or ground wire.

14. The integrated circuit chip according to claim 13 wherein material of said upper metal plate comprises aluminum, titanium, titanium nitride, tantalum, tantalum nitride or any combinations thereof.

15. The integrated circuit chip according to claim 12 wherein said lower metal plate is electrically coupled to said power or ground wire.

16. The integrated circuit chip according to claim 11 wherein said dummy lower metal plate comprises aluminum.

17. The integrated circuit chip according to claim 12 wherein said capacitor dielectric layer comprises oxide or oxide-nitride-oxide (ONO) dielectric.

18. The integrated circuit chip according to claim 11 wherein said first conductive via is thicker than said second conductive via.

19. The integrated circuit chip according to claim 11 wherein said plurality of metal layers are copper layers.

\* \* \* \* \*